United States Patent [19]

Inaba

[11] Patent Number: 5,757,067
[45] Date of Patent: May 26, 1998

[54] RESIN-SEALED TYPE SEMICONDUCTOR DEVICE

[75] Inventor: Takehito Inaba, Tokyo, Japan

[73] Assignee: NEC Corporation, Tokyo, Japan

[21] Appl. No.: 770,164

[22] Filed: Dec. 19, 1996

[30] Foreign Application Priority Data

Dec. 20, 1995 [JP] Japan .................................. 7-331667

[51] Int. Cl.$^6$ .................................................. H01L 23/495
[52] U.S. Cl. ...................... 257/666; 257/669; 257/676; 257/787
[58] Field of Search ............................. 257/666, 669, 257/674, 676, 787

[56] References Cited

U.S. PATENT DOCUMENTS 5,466,967  11/1995  Westerkamp ........................... 257/666
5,468,993  11/1995  Tani ....................................... 257/674

FOREIGN PATENT DOCUMENTS 1-298757  12/1989  Japan ............................ H01L 23/05

*Primary Examiner*—Tom Thomas
*Assistant Examiner*—Roy Potter
*Attorney, Agent, or Firm*—Young & Thompson

[57] ABSTRACT

There is provided a semiconductor device sealed therearound with resin, including (a) a lead frame formed with an island region and a plurality of inner leads, tip ends of the inner leads defining a cavity as viewed perpendicularly to a plane of the chip, the island region being located in the cavity, (b) a chip mounted on the island region of the lead frame and having a plurality of electrodes thereon, and (c) wires for connecting the electrodes of the chip to the inner leads. The cavity is defined so that a wire for connecting inner leads to electrodes located at corners on a diagonal line D1 of the chip is shortest in length and a wire for connecting one of electrodes located at a corner on a diagonal line D2 perpendicular to the diagonal line D1 is longest in length. The present invention makes it possible to shorten a wire which would receive greatest impact from molten resin in the step of introducing molten resin into a space defined by upper and lower molds and enclosing the semiconductor device therein. Hence, it is possible to prevent shortcircuits between adjacent wires in the above mentioned step, thereby providing a resin-sealed type semiconductor device with high yield and high reliability.

10 Claims, 12 Drawing Sheets

RESIN-SEALED TYPE SEMICONDUCTOR DEVICE

BACKGROUND OF THE INVENTION

1. Field of the Invention

The invention relates to a semiconductor device sealed therearound with resin, and more particularly to such a semiconductor device capable of preventing shortcircuits between adjacent wires because of deformation of wires caused by introduction of molten resin into a space in which the semiconductor device is disposed.

2. Description of the Related Art

Hereinbelow will be explained a conventional lead frame to be used for a resin-sealed type semiconductor device, with reference to FIG. 1, a plan view illustrating a conventional lead frame 1A including an island region 6, a plurality of inner leads 2A, and a plurality of outer leads 3. The lead frame 1A is manufactured by carrying out various steps such as etching and pressing to a ribbon-like thin metal plate to thereby remove sections other than the island region 6, the inner leads 2A and the outer leads 3.

A chip 5 having a plurality of electrodes or bonding pads (not illustrated) is mounted on the island region 6. Each of the electrodes is connected to each of the inner leads 2A through a wire 13. The inner leads 2A are connected to the outer leads 3 acting as lead terminals to external circuits (not illustrated). Thus, the chip 5 is electrically connected to external circuits through the wires 13, the inner leads 2A and the outer leads 3. In general, the leads 2A and 3 are made of metal such as 42 alloy and copper (Cu).

The lead frame 1A is further formed with tie bars 4 and suspension pins 8. The tie bars 4 act as a stopper for preventing molten resin from flowing to the outer leads 3 when there is carried out a step of sealing the inner leads 2A, the bonding wires 13, the island region 6 and the chip 5 with resin. The suspension pins 8 supports the island region 6 by connecting the island region 6 to a land region of the lead frame 1A.

It should be noted that the lead frame 1A is made of a thin metal plate in the form of a ribbon, and has a plurality of patterns each of which is comprised of the above mentioned constituents such as the island region 6, the inner leads 2A, the outer leads 3, the tie bars 4 and the suspension pins 8 and which are repeated in a longitudinal direction of the ribbon, namely, a right-to-left direction of a plane of FIG. 1. FIG. 1 illustrated only one of the patterns.

The lead frame 1A has formed in the land region thereof three holes 7 for positioning the lead frame 1A and also for feeding the lead frame 1A one pattern at a time while semiconductor devices are being manufactured.

In the above mentioned conventional lead frame 1A, the inner leads 2A are arranged so that tip ends thereof define a cavity 9A as viewed perpendicularly to a plane of the chip 5. As shown in FIG. 1, the cavity 9A is a square in shape similarly to the island region 6. Accordingly, wires 10A for connecting the electrodes located at four corners of the chip 5 to the associated inner leads are longest in length among all of the wires 13, and wires 11A for connecting the electrodes located in the middle of sides of the chip 5 to the associated inner leads 2A is shortest in length among all of the wires 13.

Hereinbelow is explained respective steps of a method of forming a resin-sealed type semiconductor device with reference to FIGS. 2A to 2G.

First, as illustrated in FIG. 2A, there is prepared the lead frame 1A. Then, as illustrated in FIG. 2B, the chip 5 is mounted on the island region 6 of the lead frame 1A by means of electrically conductive adhesive 12 such as silver paste. Then, as illustrated in FIG. 2C, the electrodes or bonding pads formed on the chip 5 are bonded to the inner leads 2A through the wires 13. In this wire bonding step, the suspension pins 8 may be dimpled so as to prevent edge-touch between the chip 5 and the bonding wires 13.

Then, as illustrated in FIG. 2D, the chip 5 mounted on the island region 6, the bonding wires 13 and the inner leads 2A are sealed with resin. In this resin-sealing step, the lead frame 1A is set in a cavity defined by upper and lower molds 15 and 16 therebetween, followed by introduction of molten resin into the cavity through a runner and then a gate. The resin-sealing step will be described later in more detail. After resin-sealing is completed, a semiconductor device sealed with resin is taken out of the upper and lower molds 15 and 16. Solidified resin at the runner and gate is removed.

After the tie bars 4 are cut for removal, the outer leads 3 are plated with appropriate metal, as illustrated in FIG. 2E. After, the plated outer leads 3 are separated from the lead frame 1A, as illustrated in FIG. 2F, the outer leads 3 are formed into a desired shape. Thus, a resin-sealed type semiconductor device 26A is obtained.

Hereinbelow will be detailed the resin-sealing step having been mentioned with reference to FIG. 2D. Turning to FIG. 3 illustrating the lead frame 1A (though not illustrated, the wire bonding has already been completed) set in a cavity defined by the upper and lower molds 15, 16 therebetween, resin 18 is pooled in molten condition in a pot 17 formed with the lower mold 16 heated and kept at a certain temperature. The lead frame 1A is supported in the cavity so that the island region 6 floats within a cavity 22B formed with the lower mold 16.

The lower mold 16 moves up to thereby keep the lead frame 1A supported between the upper and lower molds 15, 16, and then a plunger 29 which is initially disposed at a bottom of the resin 18 starts moving up to lift up the molten resin 18. Thus, the molten resin 18 flows in a direction 19 indicated with arrows in the order of encircled figures. Specifically, the molten resin 18 passes a runner 20 and then a gate 21 as indicated with the encircled FIGS. 1 and 2, and then flows into the cavity 22B of the lower mold 16. Then, the molten resin 18 flows along a bottom of the cavity 22B in accordance with a route indicated with the encircled FIG. 3. At the same time, the molten resin 18 passes through slits formed between the leads 2A, 3 and suspension pins 8 and slits formed between the leads 2A, 3 to flow into the upper mold 15, as indicated with the encircled FIG. 4. The molten resin 18 divided into two streams as indicated with the encircled FIGS. 3 and 4 runs on routes indicated with the encircled FIGS. 5 and 6. The molten resin 18 fills the cavities 22A and 22B therewith in the above mentioned way, and flows towards a vent 23 formed with the upper and lower molds 15, 16. Thus, the chip 5 mounted on the island region 6 of the lead frame 1A is sealed with resin.

However, a resin-sealed type semiconductor device employing the above mentioned conventional lead frame has a problem that adjacent wires tend to come into contact with each other causing a shortcircuit problem. Hereinbelow, this problem is explained in detail.

As mentioned earlier with reference to FIG. 1, the cavity 9A defined by tip ends of the inner leads 2A is a square in shape in accordance with the shape of the island region 6. As a result, the wires 10A for connecting the electrodes located at four corners of the chip 5 to the associated inner leads are longest in length among all of the wires 13, and the wires 11A for connecting the electrodes located in the middle of sides of the chip 5 to the associated inner leads is shortest in length among all of the wires 13.

Turning to FIG. 4 showing directions of the resin flow as viewed from above in the resin-sealing step as illustrated in FIG. 2D, the molten resin 18 forced into the cavities 22A and 22B through the gate 21 is filling the cavities 22A and 22B therewith in the resin-flow direction 19 indicated with arrows in FIG. 3. When the molten resin 18 flows into the cavities 22A and 22B, wires $24_{A1}$ and $24_{A2}$ extending almost perpendicularly to the gate 21 receive the greatest impact among the wires for connecting the electrodes located at the corners of the chip 5 to the associated inner leads. However, as mentioned earlier, the wires $24_{A1}$ and $24_{A2}$ are longest among all the wires 13 in the conventional lead frame 1A. In brief, the molten resin 18 exerts the greatest pressure on the longest wires. As a result, the longest wires $24_{A1}$ and $24_{A2}$ induce the greatest wire deformation or dip, which in turn causes shortcircuits between adjacent wires $W_1$ and $W_3$ and between adjacent wires $W_2$ and $W_4$.

Those skilled in the art would realize that it is effective to shorten wires in order to prevent occurrence of shortcircuits caused by the wire deformation or dip. In order to shorten all the wires, tip ends of all the inner leads 2A have to be positioned closer to the island region 6 than before, which means that a pitch between tip ends of the inner leads 2A has to be made narrower than before. If the number of inner leads to be arranged and the pitch between tip ends of the inner leads are determined, a requisite length or a length of a side of the cavity 9A over which the determined number of inner leads are arranged can be determined with the result that an interval between a chip and tip ends of inner leads is also determined. Accordingly, the cavity 9A has to have a shorter side in order for tip ends of inner leads to be located closer to a chip, which in turn means that a pitch between tip ends of inner leads has to be made narrower.

However, a pitch between tip ends of inner leads has almost reached the lower limit these days, and hence, it is quit difficult or almost impossible to make a pitch narrower. On the other hand, a chip is requested to be smaller and smaller with a semiconductor device getting smaller and smaller in size, and thus, bonding pads or electrodes tend to be disposed closer to a center of a chip as the pitch is made smaller and smaller.

Namely, it is difficult to dispose tip ends of inner leads closer to an island region, whereas bonding pads or electrodes formed with a chip tend to be disposed farther away from inner leads. As a result, a wire length has to be longer and longer, and accordingly wire deformation or wire dip caused by molten resin flow impact becomes greater and greater. Because of the above discussed reasons, wires $W_1$ and $W_3$, and wires $W_2$ and $W_4$ are likely to contact with each other to thereby cause a shortcircuit with the result of problems of reduction in yield and reliability.

In order to solve the above mentioned problems, and with reference to FIG. 5, Japanese Unexamined Patent Publication No. 1-298757 has suggested a lead frame formed with inner leads 30A, which are to be connected to bonding pads located at corners of a chip 5, having Y-shaped tip ends in accordance with a shape of corners of the chip 5 with an interval between tip ends of the inner leads 2A and the island region 6 being kept unchanged. The inner leads 30A makes it possible to carry out wire-bonding so that a wire 10A for connecting an inner lead to a bonding pad located at a corner of the chip 5 makes almost 90 degrees angle with a side 5A of the chip 5. Thus, the wire 10A can be made shorter in length than a conventional one.

The Publication No. 1-298757 does not have as an object the prevention of shortcircuits between adjacent wires caused by molten resin flow pressure in a resin-sealing step, but has as an object the prevention of shortcircuits between the island region 6 and the wire 10A by preventing horizontal dip of bonded wires which would be caused by longer length of wires. However, since it is possible to shorten a length of wires connecting bonding pads located at corners of a chip to associated inner leads, it is considered that the lead frame 30A would be effective for preventing shortcircuits between adjacent wires.

However, the lead frame 30A suggested in the Publication No. 1-298757 has a problem as follows. As mentioned earlier, a pitch between tip ends of inner leads has almost reached the lower limit, and hence it is considered that it is not possible to have a space for inner leads having Y-shaped tip ends. Thus, the lead frame suggested in the Publication No. 1-298757 is not practically suitable for a recent semiconductor device having high integration where a greater number of pins are arranged in a smaller pitch.

SUMMARY OF THE INVENTION

It is an object of the present invention to provide a semiconductor device having a lead frame capable of preventing shortcircuits between adjacent wires caused by molten resin flow pressure in a resin-sealing step with a pitch between tip ends of inner leads being kept the same as or not allowing to become greater than a pitch between tip ends of inner leads in a conventional lead frame.

There is provided a semiconductor device sealed therearound with resin, including (a) a lead frame formed with an island region and a plurality of inner leads, tip ends of the inner leads defining a cavity as viewed perpendicularly to a plane of a chip, the island region being located in the cavity, (b) a chip mounted on the island region of the lead frame and having a plurality of electrodes thereon, and (c) wires for connecting the electrodes of the chip to the inner leads. The cavity is designed to have a perimeter which has segments making an angle with each of sides of the chip so that a tip end of an inner lead to be connected to an electrode located at a corner of the chip is disposed closer to the island region of the chip than other tip ends of the inner leads.

There is further provided a semiconductor device sealed therearound with resin, including (a) a lead frame formed with an island region and a plurality of inner leads disposed around the island region, (b) a chip mounted on the island region of the lead frame and having a plurality of electrodes thereon, and (c) wires for connecting the electrodes of the chip to the inner leads. In this semiconductor device, an inner lead A to be connected to an electrode B located at a corner of the chip being disposed close to the island region so that a wire for connecting the inner lead A to the electrode B is smaller in length than other wires.

The cavity is preferably formed into a polygon having 4N sides where N is a positive integer equal to or greater than 2. The cavity may be formed into a circle.

There is still further provided a semiconductor device sealed therearound with resin, including (a) a lead frame formed with an island region and a plurality of inner leads, tip ends of the inner leads defining a cavity as viewed perpendicularly to a plane of a chip, the island region being located in the cavity, (b) a chip mounted on the island region of the lead frame and having a plurality of electrodes thereon, (c) wires for connecting the electrodes of the chip to the inner leads. The cavity is designed to have a perimeter which has segments making an angle with each of sides of the chip so that tip ends of inner leads L1 to be connected to electrodes located at corners on a diagonal line D1 of the chip are disposed closest to the island region of the chip and a tip end of an inner lead to be connected to one of electrodes located at a corner on a diagonal line D2 of the chip perpendicular to the diagonal line D1 is disposed remotest from the island region of the chip.

The chip is preferably positioned so that the diagonal line D1 extends perpendicularly to a gate through which molten resin is introduced into a space which is defined by upper and lower molds therebetween and in which the chip is placed, and the diagonal line D2 extends in the same direction as the gate.

There is yet further provided a semiconductor device sealed therearound with resin, including (a) a lead frame formed with an island region and a plurality of inner leads, tip ends of the inner leads defining a cavity as viewed perpendicularly to a plane of a chip, the island region being located in the cavity, (b) a chip mounted on the island region of the lead frame and having a plurality of electrodes thereon, and (c) wires for connecting the electrodes of the chip to the inner leads. The cavity is defined so that a wire for connecting inner leads L1 to electrodes located at corners on a diagonal line D1 of the chip is shortest in length and a wire for connecting one of electrodes located at a corner on a diagonal line D2 of the chip perpendicular to the diagonal line D1 is longest in length.

In accordance with the above mentioned present invention, it is possible to shorten a wire which would receive the greatest impact by molten resin flow in a resin-sealing step, thereby making it possible to prevent shortcircuits between adjacent wires with the result of higher yield and reliability. In addition, as it is not necessary to change a pitch between tip ends of inner leads, a lead frame in accordance with the present invention can be performed by existing techniques for forming a lead frame.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings:

FIGS. 7A and 7B are plan views for comparing conventional lead frames with a lead frame made in accordance with the first embodiment with respect to a length of a wire for connecting a bonding pad located at a corner of a chip to an associated inner lead between;

DESCRIPTION OF THE PREFERRED EMBODIMENTS

Figure 1:
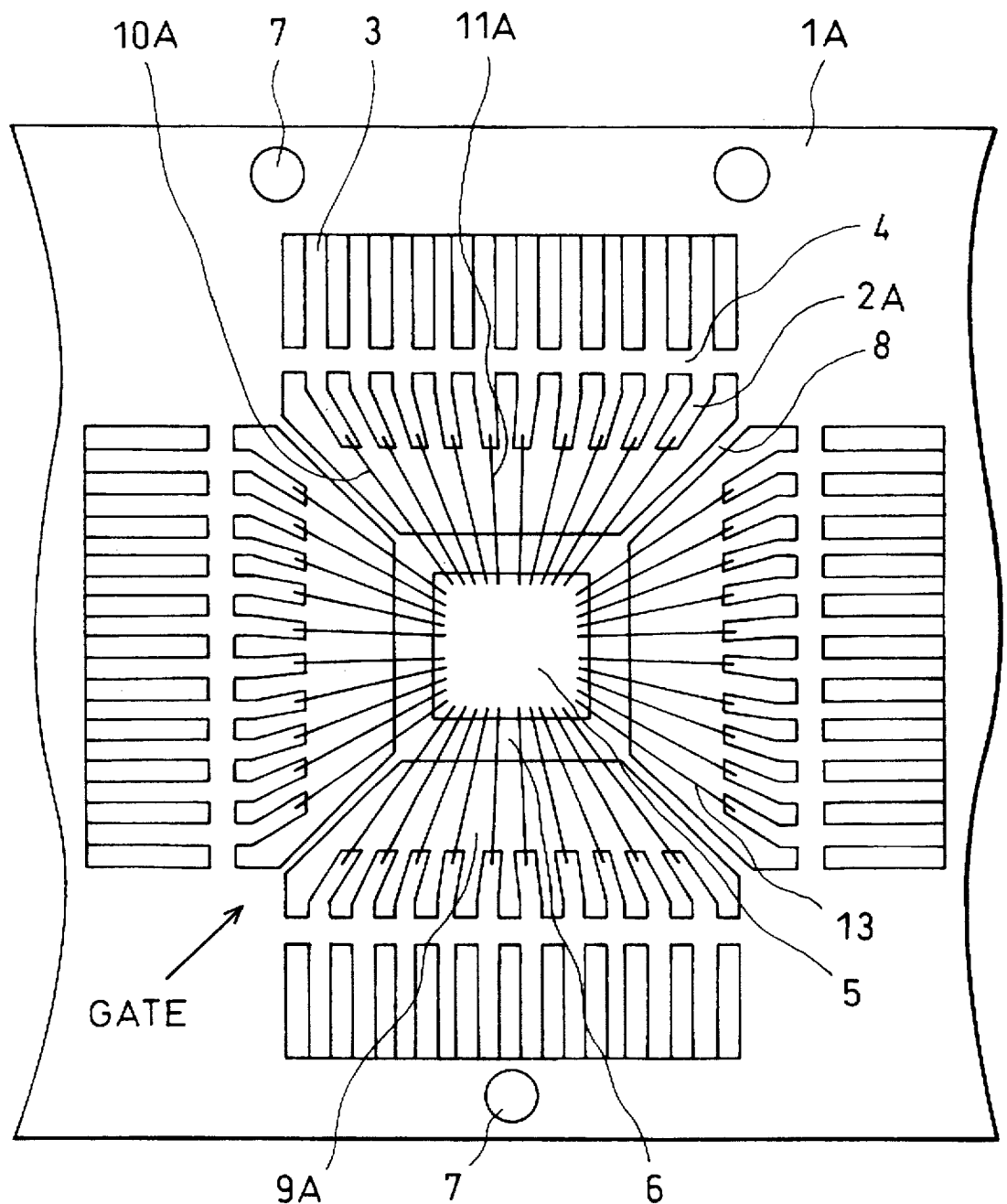
FIG. 1 is a plan view illustrating a conventional lead frame on which is mounted a chip connected to inner leads through wires.
Figure 2A:
FIGS. 2A to 2G are schematic views illustrating steps of a method of manufacturing a resin-sealed type semiconductor device.
Figure 2B:
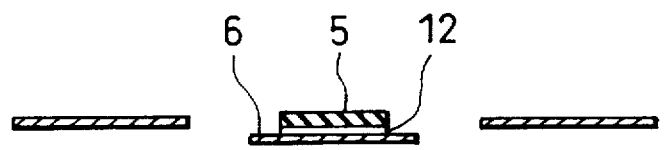
Figure 2C:
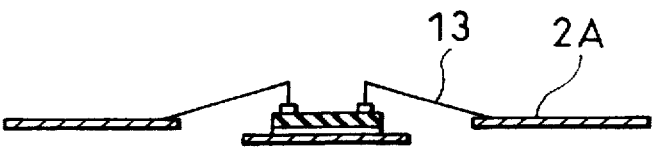
Figure 2D:
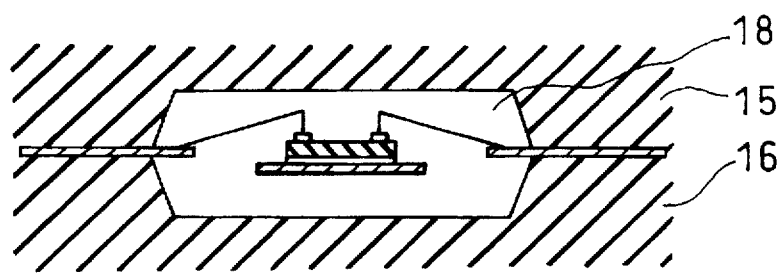
Figure 2E:
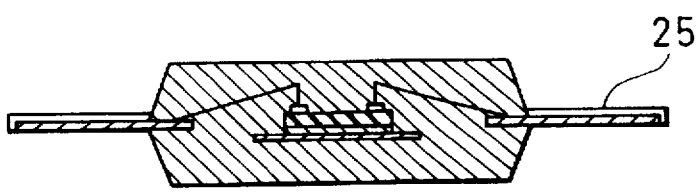
Figure 2F:
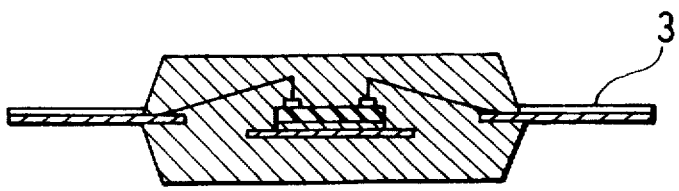
Figure 2G:
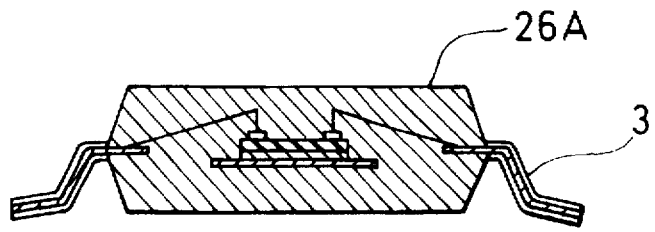
Figure 3:
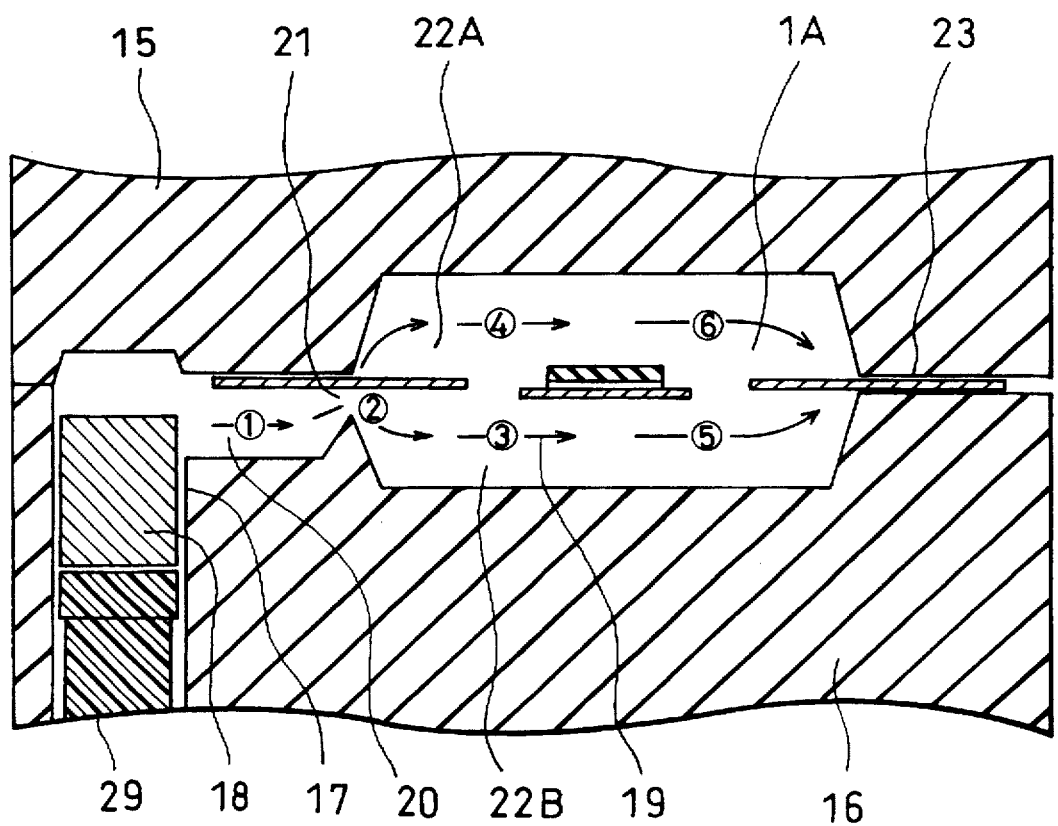
FIG. 3 is a cross-sectional view showing a molten resin flow direction in a resin-sealing step.
Figure 4:
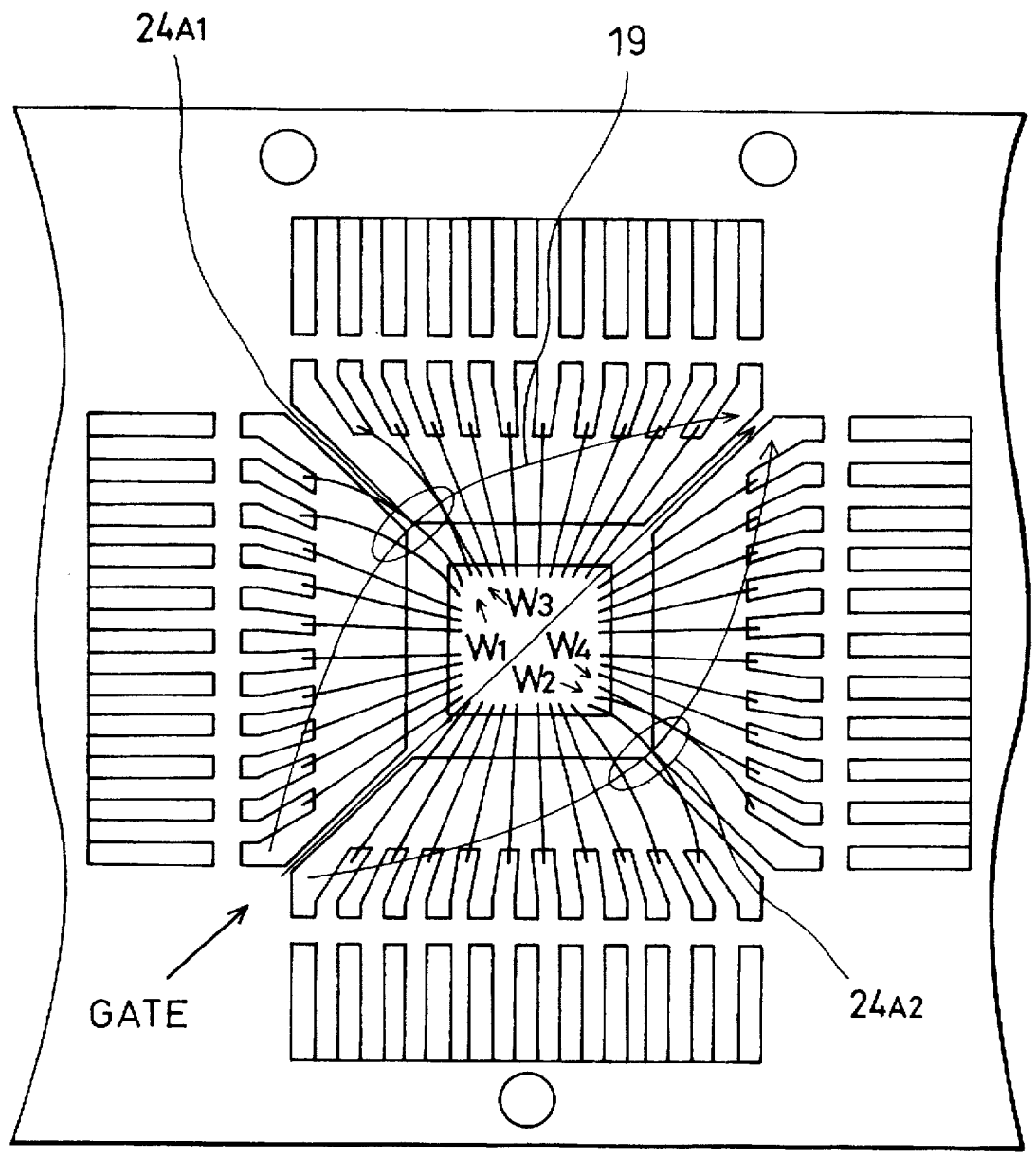
FIG. 4 is a plan view showing a molten resin flow direction in the conventional lead frame illustrated in FIG. 1.
Figure 5:
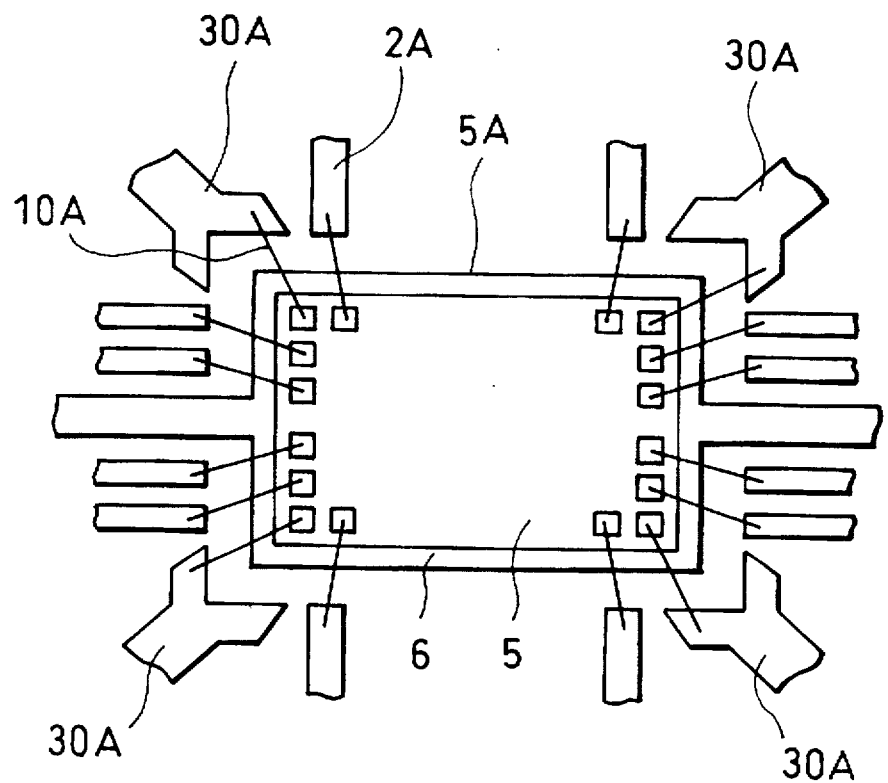
FIG. 5 is a plan view illustrating another conventional lead frame.
Figure 6:
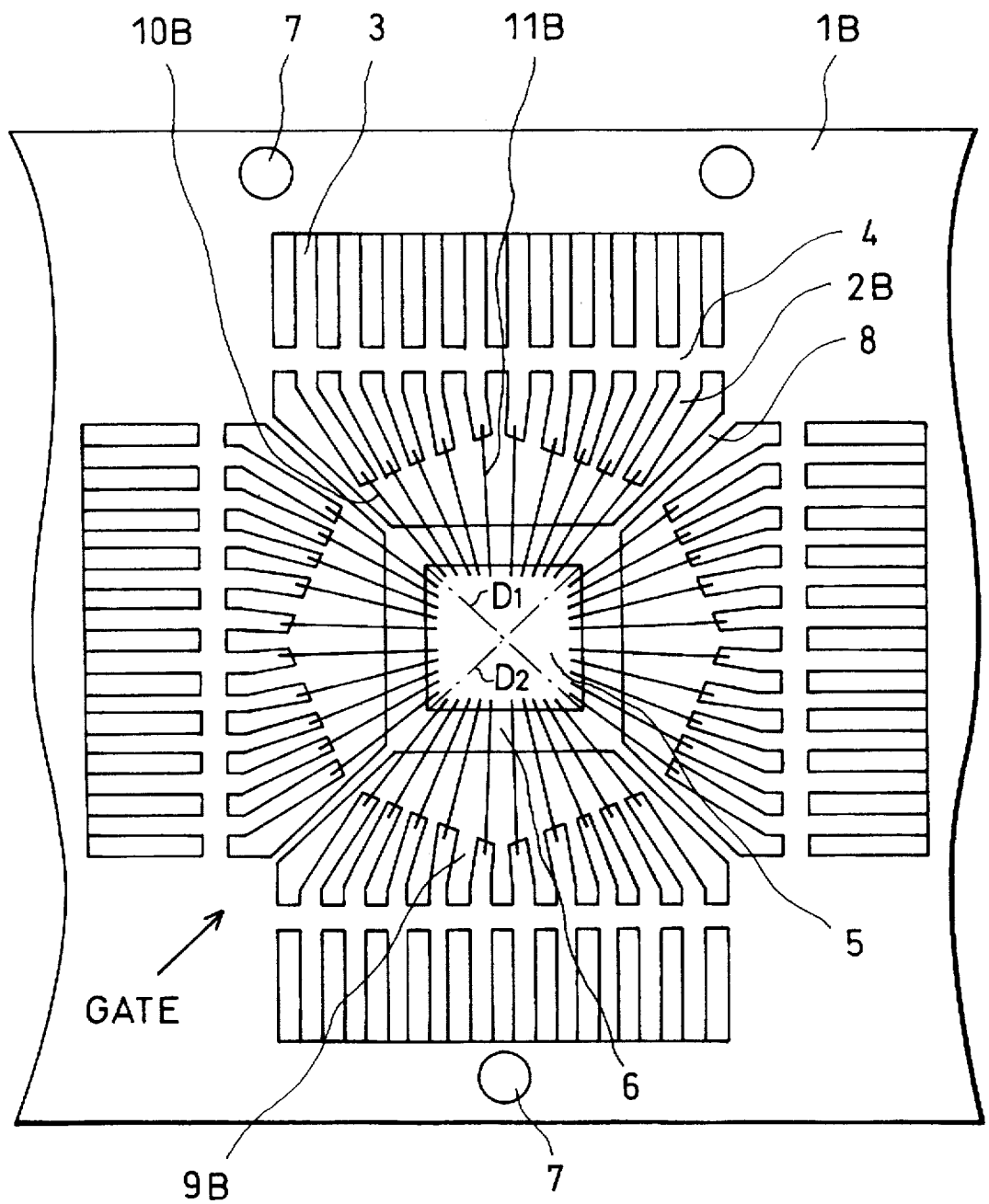
FIG. 6 is a plan view illustrating a lead frame on which is mounted a chip connected to inner leads through wires, to be made in accordance with the first embodiment of the present invention.

FIG. 6 illustrates a lead frame made in accordance with the first embodiment. Comparing the conventional lead frame 1A illustrated in FIG. 1 to the lead frame 1B illustrated in FIG. 6, the first embodiment is different from the conventional lead frame in that a cavity 9B defined by tip ends of inner leads 2B is an octagon in shape. Eight apexes of the octagon defined by tip ends of the inner leads 2B are located on extensions of diagonal lines D1, D2 of the chip 5 and extensions of lines connecting a center of the chip 5 to midpoints of sides of the chip 5. The arrangement of the eight apexes in such a way causes that wires 10B for connecting bonding pads located at corners of the chip 5 to the associated inner leads are shortest in length among all wires and wires 11B for connecting bonding pads located at the middle of sides of the chip 5 to the associated inner leads are longest in length among all wires.

Figure 7A:
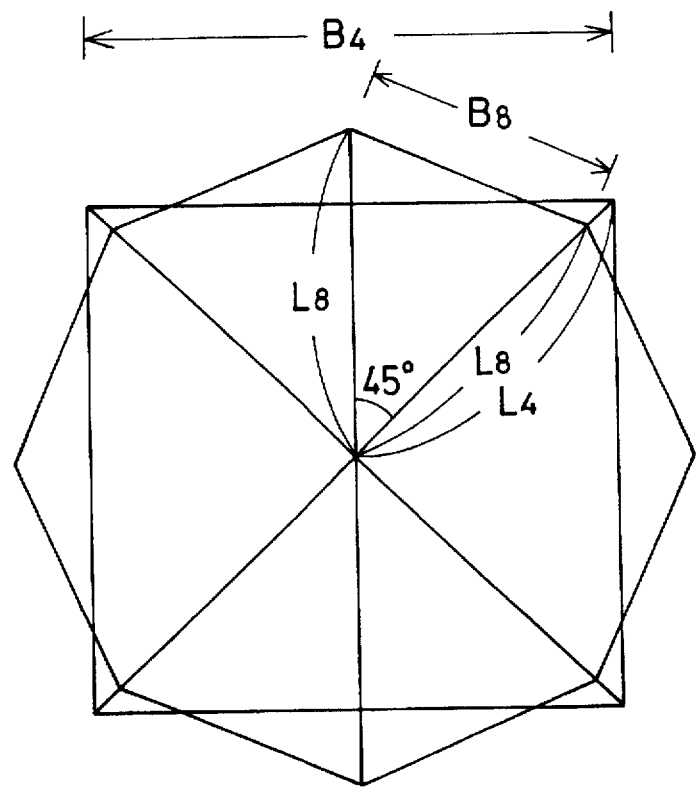

Hereinbelow is proved that the first embodiment makes wires for connecting bonding pads located at corners of a chip to associated inner leads shorter than similar wires in a conventional lead frame. As illustrated in FIG. 7A, a square-shaped cavity is overlapped on an octagon-shaped cavity so that eight apexes of the octagon-shaped cavity are located on diagonal lines of the square-shaped cavity and extensions of lines connecting a center of the square-shaped cavity to midpoints of sides of the square-shaped cavity. For simplicity, the square-shaped cavity is assumed to have a center which is coincident with a center of the octagon-shaped cavity. A distance of a side of the square-shaped cavity is indicated with $B_4$, and a distance from a center to an apex in the square-shaped cavity is indicated with $L_4$. Similarly, a distance of a side of the octagon-shaped cavity is indicated with $B_8$, and a distance from a center to an apex in the octagon-shaped cavity is indicated with $L_8$.

Since an apex angle for a side of the square-shaped cavity is 90 degrees, the length $B_4$ of a side of the square-shaped cavity is defined by the following equation.

$$B_4 = 2 \sin(90°/2) \times L_4$$

Similarly, since an apex angle for a side of the octagon-shaped cavity is 45 degrees, the length $B_8$ of a side of the octagon-shaped cavity is defined by the following equation.

$$B_8 = 2 \sin(45°/2) \times L_8$$

In order to dispose the same number of inner leads at the same pitch around the square- and octagon-shaped cavities, the length $B_4$ has to be equal to twice the length $B_8$.

$$B_4=2\times B_8$$

Accordingly, $$2\sin(90°/2)\times L_4=2\times 2\sin(45°/2)\times L_8$$

Hence, $$L_8=(½)\times(\sin 45°/\sin 22.5°)L_4\approx 0.924L_4$$

This means that the lead frame 1B having the octagon-shaped cavity 9B in accordance with the first embodiment can make the wires 10B for connecting bonding pads located at corners of a chip to associated inner leads shorter than the similar wires in a conventional lead frame having the square-shaped cavity, if the same number of inner leads are arranged at the same pitch.

Figure 7B:
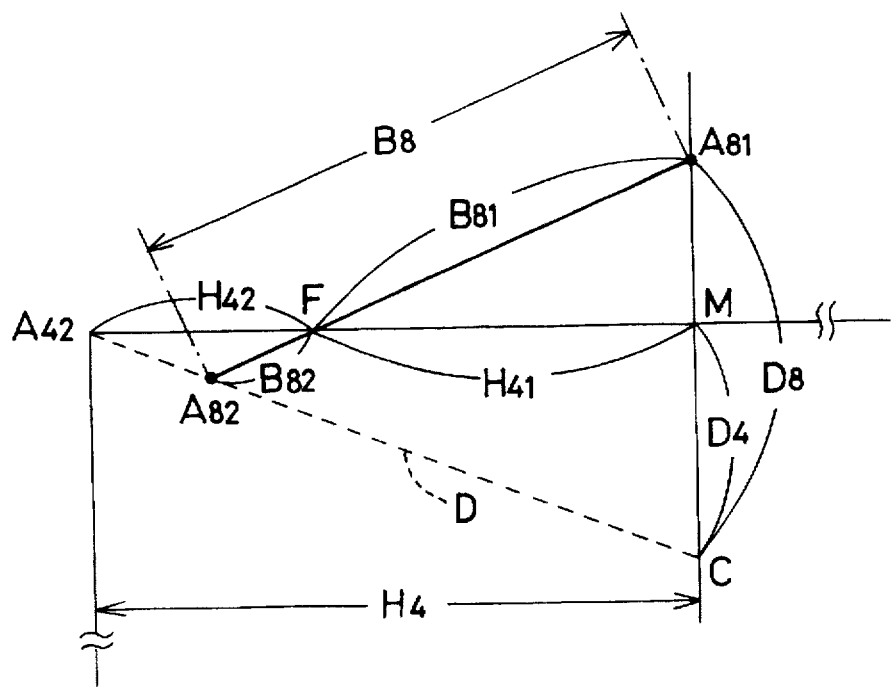

FIG. 7B shows comparison between the lead frame 2B having the above mentioned octagon-shaped cavity and another conventional lead frame having a rectangular cavity. FIG. 7B partially shows the rectangular cavity around a corner thereof. As mentioned later in detail, wires for connecting bonding pads located at corners of a chip to associated inner leads can be made shorter in the octagon-shaped cavity than in the rectangular cavity.

A distance $D_8$ measured from a center C of a chip to an apex $A_{81}$ of the octagon-shaped cavity is designed to be greater than a distance $D_4$ measured from the center C of a chip to a midpoint M of a side of the rectangular cavity ($D_8>D_4$). Assuming that a side $B_8$ of the octagon-shaped cavity intersects with a side of the rectangular cavity at an intersection F, a length of the side $B_8$ and a length of a half-side $H_4$ of the rectangular cavity is defined as follows.

$$B_8=B_{81}B_{82}$$

$$H_4=H_{41}+H_{42}$$

wherein $B_{81}$, indicates a length between the apex $A_{81}$, and the intersection F. $B_{82}$ indicates a length between the intersection F and an intersection $A_{82}$ of the side $B_8$ with a diagonal line D of the rectangular cavity. $H_{41}$ indicates a length between the midpoint M and the intersection F, and $H_{42}$ indicates a length between the intersection F and an apex $A_{42}$ of the rectangular cavity. Now comparing the length $B_{81}$ to the length $H_{41}$, the length $B_{81}$, is greater than the length $H_{41}$ ($B_{81}>H_{41}$). Hence, in order to equalize a distance for arranging the same number of inner leads ($B_8=H_4$), the length $B_{82}$ is required to be greater than the length $H_{42}$. Thus, the apex $A_{82}$ of the octagon-shaped cavity is sure to be located closer to the center C of a chip than the apex $A_{42}$ of the rectangular cavity.

Figure 8:
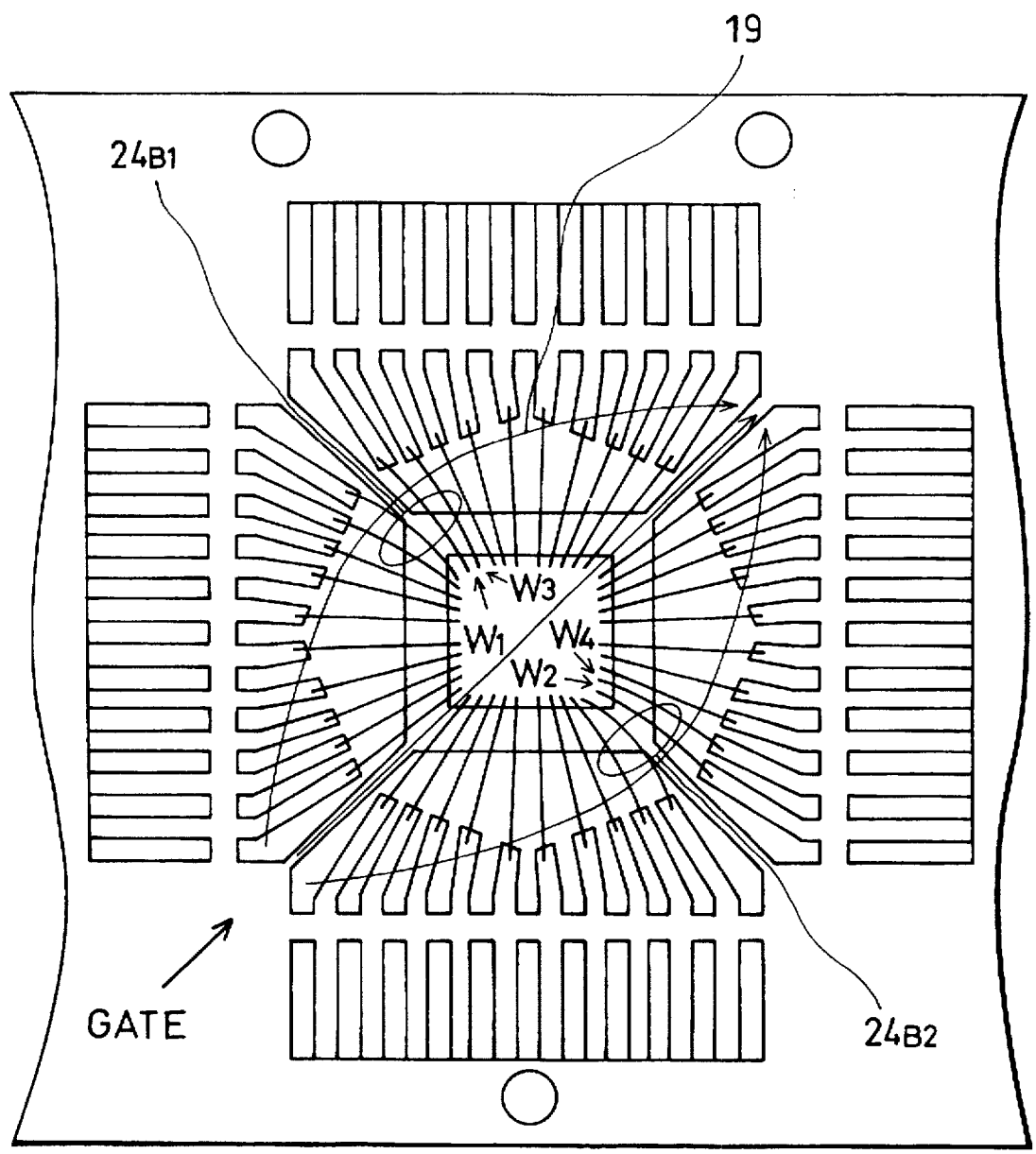
FIG. 8 is a plan view showing a molten resin flow direction in a lead frame made in accordance with the first embodiment.

FIG. 8 shows directions of molten resin flow in the lead frame 1B in a resin-sealing step, as viewed from above. As will be obvious to those skilled in the art, wires $24_{B1}$ and $24_{B2}$ extending perpendicularly to the gate 21 receive the greatest pressure among all wires from molten resin flowing over the lead frame 1B. However, in the lead frame 1B made in accordance with the first embodiment, the wires $24_{B1}$, and $24_{B2}$ have the smallest length among all the wires and, in addition, have a smaller length than similar wires in a conventional lead frame. Thus, there does scarcely occur wire deformation or dip on the wires $24_{B1}$ and $24_{B2}$, and hence there does not occur shortcircuit between the wires $24_{B1}$, $24_{B2}$ and adjacent wires thereof.

Table 1 shows data obtained when the lead frame 1B made in accordance with the first embodiment was applied to LSI having 208 pins. As shown, a length of a wire for connecting a bonding pad located at a corner of a chip to an associated inner lead can be made smaller from 4.9 mm to 4.1 mm, which in turn reduced a wire deformation or dip down to 185 μm from 378 μm. As a result, a rate of shortcircuit occurrence between adjacent wires, which was about 28% in a conventional lead frame, was reduced down to about 0%.

TABLE 1

|  | Conventional Lead Frame | First Embodiment Lead Frame |
|---|---|---|
| Inner Lead Tip End Pitch | 220.0 μm | 220.0 μm |
| Length of Wires A | 4.9 mm | 4.1 mm |
| Length of Wires B | 4.1 mm | 4.9 mm |
| Wire Dip | about 375 μm | about 185 μm |
| Shortcircuit Occurrence Rate | about 28% | about 0% |

In Table 1, wires A indicate wires for connecting bonding pads located at corners of a chip to associated inner leads, and wires B indicate wires for connecting bonding pads located at a midpoint of a side of a chip to associated inner leads.

Figure 9:
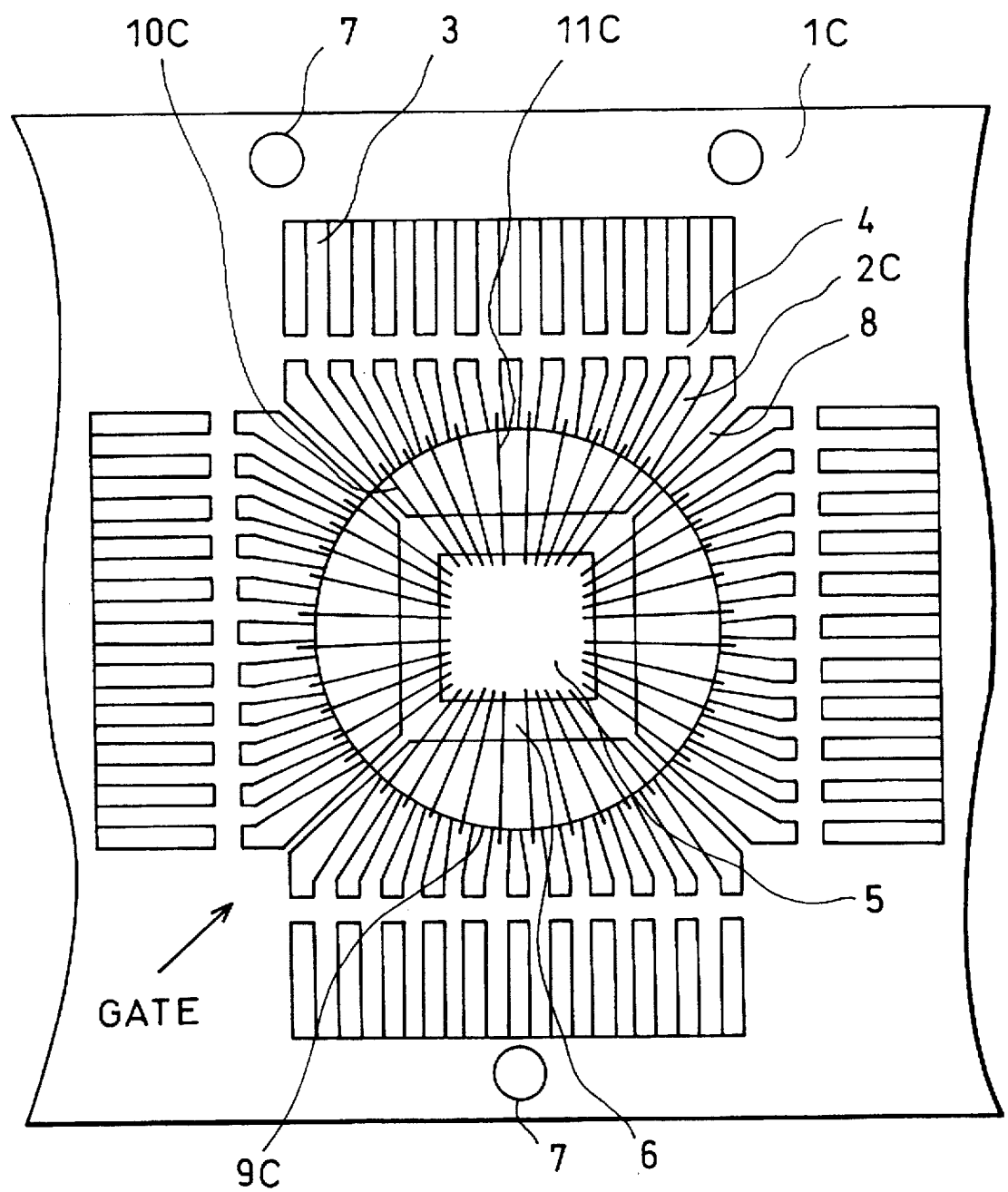
FIG. 9 is a plan view illustrating a lead frame on which is mounted a chip connected to inner leads through wires, to be made in accordance with the second embodiment of the present invention.

Hereinbelow is explained a lead frame 1C made in accordance with the second embodiment of the present invention with reference to FIG. 9. In the illustrated lead frame 1C, a cavity 9C defined by tip ends of inner leads is formed into a circle in shape.

Assuming that the circular cavity 9C has a radius R, a length A of a quarter of a circle is defined by the following equation.

$$A=(¼)\times 2\pi R$$

In order to arrange the same number of inner leads at the same pitch, the length A has to be equal to the length $B_4$ of a side of the conventional square-shaped cavity.

$$B_4=2\sin(90°/2)\times L_4$$

Hence, $$R=4(1/\pi)\sin 45°\times L_4\approx 0.900\times L_4$$

Thus, a length of the wires A can be made smaller than a length of the similar wires in the first embodiment.

Figure 10:
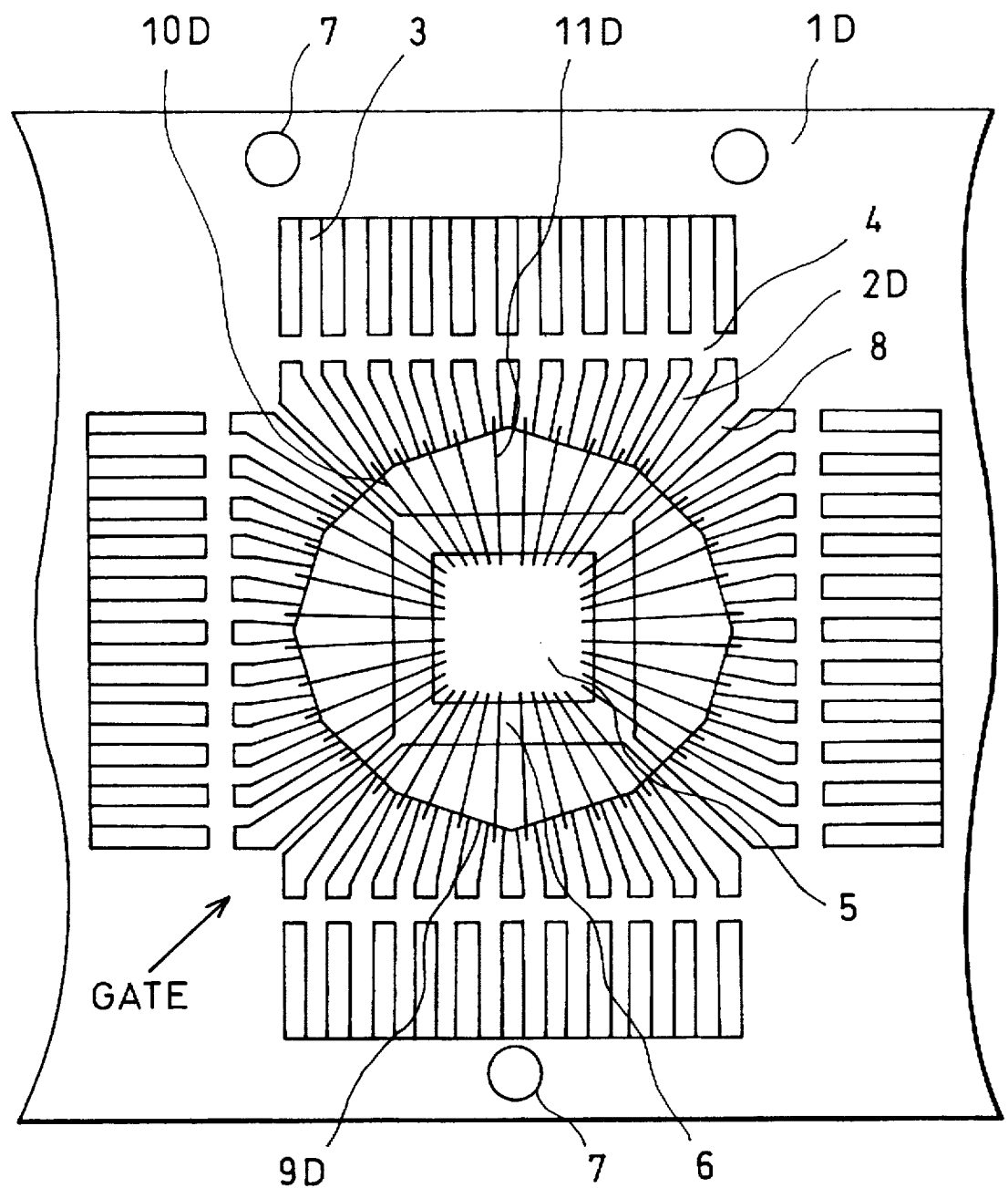
FIG. 10 is a plan view illustrating a lead frame on which is mounted a chip connected to inner leads through wires, to be made in accordance with the third embodiment of the present invention.

Hereinbelow is explained a lead frame 1D made in accordance with the third embodiment of the present invention with reference to FIG. 10. In the illustrated lead frame 1D, a cavity 9D defined by tip ends of inner leads is formed into a twelve-side polygon in shape.

With respect to a length of wires for connecting bonding pads located at corners of a chip to associated inner leads, a circular cavity is more advantageous than a polygon-shaped cavity. For example, hereinbelow is made a comparison between a circular cavity and a sixteen-side polygon with respect to a distance measured from a center of a chip to an apex or circumference. A distance $L_{16}$ from a center to an apex in a sixteen-side polygon is represented as follows.

$$L_{16}=(¼)\{\sin 45°/\sin(45°/4)\}\times L_4\approx 0.906\times L_4$$

As mentioned earlier, a distance R from a center to a circumference in a circular cavity is represented as follows.

$$R\approx 0.900\times L_4$$

Thus, a wire for connecting bonding pads located at corners of a chip to associated inner leads in a circular cavity can be made smaller in length than that of a polygon-shaped cavity.

However, the twelve-side cavity in the third embodiment provides an advantage that a lead frame can be more readily fabricated than a circular cavity. In fabrication of a lead frame, tip ends of inner leads are in general cut with a tip-end cutting die and punch. If a cavity has an arcuate segment in its outer periphery, a die and a punch for cutting tip ends have to have an arcuate segment. However, it is quite difficult to make a die and a punch so as to have an arcuate segment. In accordance with the third embodiment, though an outer periphery of the twelve-side polygon cavity is analogous to a circumference of a circle, it is possible to consist the die and punch only of linear segments, which makes it possible to make the die and punch without much difficulty.

In the above mentioned embodiments, a cavity is designed to have an octagon shape or a twelve-side polygon, but an outer periphery of a cavity in a lead frame in accordance with the present invention is not to be limited to those. A cavity in a lead frame in accordance with the present invention may be designed to be a 4N-side polygon in shape where N is a positive integer equal to or greater than 2. For example, a cavity may be formed into a sixteen-side polygon in shape.

Figure 11:
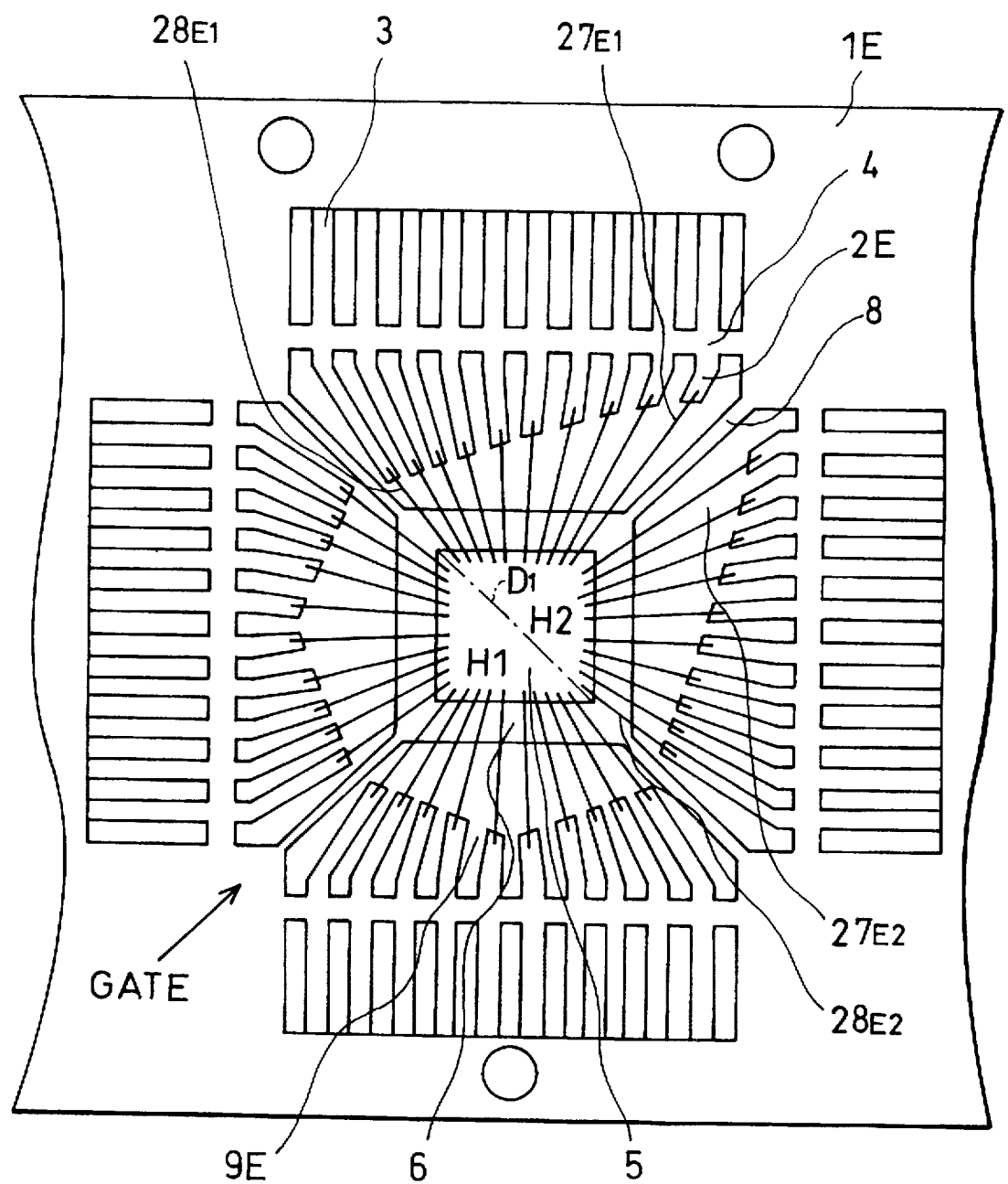
FIG. 11 is a plan view illustrating a lead frame on which is mounted a chip connected to inner leads through wires, to be made in accordance with the fourth embodiment of the present invention.
Figure 12:
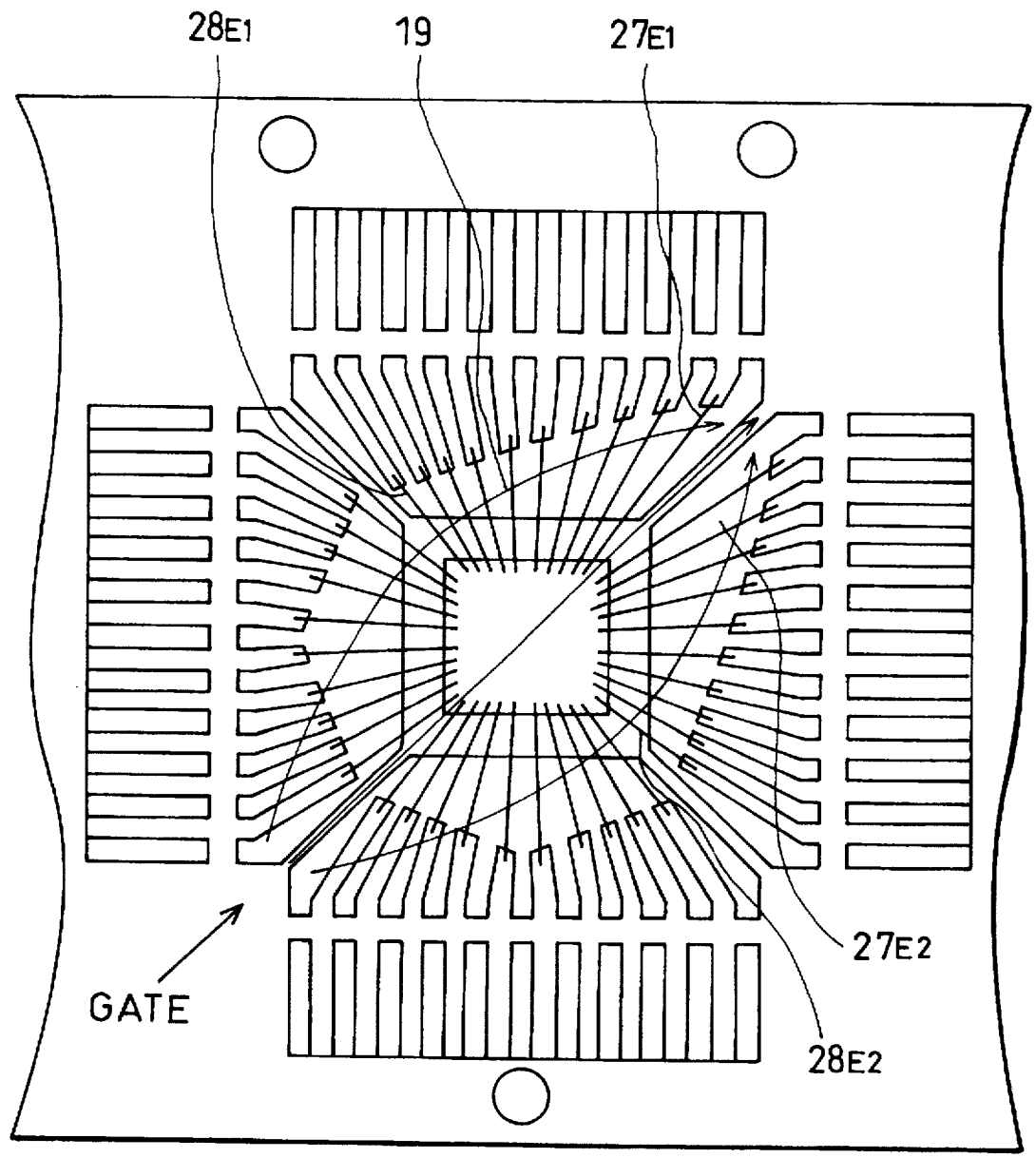
FIG. 12 is a plan view showing a molten resin flow direction in a lead frame made in accordance with the fourth embodiment.

Hereinbelow is explained a lead frame 1E made in accordance with the fourth embodiment of the present invention with reference to FIG. 11. In the illustrated lead frame 1E, a cavity 9E defined by tip ends of inner leads is constituted of two halves H1 and H2 defined by dividing the cavity 9E into two portions with respect to a diagonal line D1 of the chip 5 perpendicular to the gate 20. The half H1 is closer to the gate 20 and the half H2 is remoter from the gate 20, and the halves H1 and H2 are asymmetrical with each other. The half H1 is an octagon-half in shape, whereas the half H2 is shaped so that an inner lead 2E therein located remoter from the diagonal line D1 of the chip 5 is remoter from the island region 6. Namely, a wire for connecting a bonding pad to an associated inner lead located remoter from the diagonal line D1 is designed to have a greater length. In the illustrated embodiment, wires $27_{E1}$ and $27_{E2}$ for connecting bonding pads located at a corner of the chip 5 and at the opposite side of the gate 20 to associated inner leads are designed to have a greatest length among all the wires, whereas wires $28_{E1}$ and $28_{E2}$ for connecting bonding pads located on the diagonal line D1 of the chip 5 to associated inner leads are designed to have a shortest length among all the wires. Thus, the wires $28_{E1}$ and $28_{E2}$ having the shortest length in the fourth embodiment can be made shorter than the shortest wires in the above mentioned first to third embodiments.

In the lead frame 1E made in accordance with the fourth embodiment, a wire length gradually increases along the molten resin flow direction 19. Accordingly, the wire deformation or dip increases along the molten resin flow direction 19. As a result, even if the longest wires $27_{E1}$ and $27_{E2}$ extending perpendicularly to the diagonal line D1 of the chip 5 are deformed or dipped, it is possible to keep all the wires in no contact with one another.

In the above mentioned first to fourth embodiments, a chip is a square or a rectangle, but it should be noted that the present invention is able to be applied to any chip having a shape other than a square and a rectangle.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor device sealed therearound with resin, comprising:

a lead frame formed with an island region and a plurality of inner leads, tip ends of said inner leads defining a cavity as viewed perpendicularly to a plane of a chip, said island region being located in said cavity;

a chip mounted on said island region of said lead frame and having a plurality of electrodes thereon; and wires for connecting said electrodes of said chip to said inner leads, said cavity having a perimeter which has segments making an angle with each of sides of said chip so that tip ends of inner leads L1 to be connected to electrodes located at corners on a diagonal line D1 of said chip are disposed closest to said island region of said chip and a tip end of an inner lead to be connected to one of electrodes located at a corner on a diagonal line D2 of said chip perpendicular to said diagonal line D1 is disposed remotest from said island region of said chip.

2. The semiconductor device as set forth in claim 1, wherein said chip is positioned so that said diagonal line D1 extends perpendicularly to a gate through which molten resin is introduced into a space which is defined by upper and lower molds therebetween and in which said chip is placed, and said diagonal line D2 extends in the same direction as said gate.

3. The semiconductor device as set forth in claim 2, wherein a half of said cavity located closer to said gate is asymmetrical with another half of said cavity located remoter from said gate.

4. The semiconductor device as set forth in claim 3, wherein inner leads located in said another half of said cavity are arranged so that an inner lead located remoter from said inner leads L1 is positioned remoter from said island region of said chip.

5. The semiconductor device as set forth in claim 3, wherein said half of said cavity has a half-octagon shape.

6. A semiconductor device sealed therearound with resin, comprising:

a lead frame formed with an island region and a plurality of inner leads, tip ends of said inner leads defining a cavity as viewed perpendicularly to a plane of a chip, said island region being located in said cavity;

a chip mounted on said island region of said lead frame and having a plurality of electrodes thereon; and wires for connecting said electrodes of said chip to said inner leads, said cavity being defined so that a wire for connecting inner leads L1 to electrodes located at corners on a diagonal line D1 of said chip is shortest in length and a wire for connecting one of electrodes located at a corner on a diagonal line D2 of said chip perpendicular to said diagonal line D1 is longest in length.

7. The semiconductor device as set forth in claim 6, wherein said chip is positioned so that said diagonal line D1 extends perpendicularly to a gate through which molten resin is introduced into a space which is defined by upper and lower molds therebetween and in which said chip is placed, and said diagonal line D2 extends in the same direction as said gate.

8. The semiconductor device as set forth in claim 7, wherein a half H1 of said cavity located closer to said gate is asymmetrical with another half H2 of said cavity located remoter from said gate.

9. The semiconductor device as set forth in claim 8, wherein inner leads located in said another half H2 of said cavity are arranged so that a wire for connecting an electrode to an associated inner lead located remoter from said inner leads L1 is designed to have a greater length.

10. The semiconductor device as set forth in claim 8, wherein said half H1 of said cavity is an octagon-half in shape.

* * * * *